United States Patent
Shiah

(10) Patent No.: US 7,466,013 B2
(45) Date of Patent: Dec. 16, 2008

(54) SEMICONDUCTOR DIE STRUCTURE FEATURING A TRIPLE PAD ORGANIZATION

(75) Inventor: Chun Shiah, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 358 days.

(21) Appl. No.: 11/305,383

(22) Filed: Dec. 15, 2005

(65) Prior Publication Data

US 2007/0138609 A1    Jun. 21, 2007

(51) Int. Cl.
*H01L 23/52*    (2006.01)
*H01L 23/053*    (2006.01)
*H01L 23/48*    (2006.01)
*H01L 23/495*    (2006.01)

(52) U.S. Cl. .............................. 257/673; 257/E23.039; 257/E23.179; 257/E23.014; 257/E23.079; 257/E23.141; 257/784; 257/786; 257/692; 257/691; 257/666; 257/672; 257/696; 257/E23.02

(58) Field of Classification Search ................. 257/673, 257/E23.039, E23.02, E23.179, E23.014, 257/E23.079, E23.141, 784, 786, 692, 691, 257/666, 672, 735, 696
See application file for complete search history.

(56) References Cited

U.S. PATENT DOCUMENTS

| | | | |
|---|---|---|---|
| 4,685,998 A | | 8/1987 | Quinn et al. |
| 5,012,187 A | | 4/1991 | Littlebury |
| 5,455,200 A | * | 10/1995 | Bigler et al. ............ 29/827 |
| 5,545,920 A | * | 8/1996 | Russell .................. 257/666 |
| 6,064,112 A | * | 5/2000 | Iwaya et al. ............. 257/673 |
| 6,326,801 B1 | | 12/2001 | Whetsel |
| 6,396,300 B1 | | 5/2002 | Loughmiller et al. |
| 6,469,327 B1 | | 10/2002 | Yasuda et al. |
| 7,307,353 B2 | * | 12/2007 | Stroupe .................. 257/786 |
| 7,329,597 B2 | * | 2/2008 | Chung et al. ............. 438/611 |
| 2003/0127713 A1 | * | 7/2003 | Schoenfeld .............. 257/666 |
| 2003/0189925 A1 | * | 10/2003 | Wellbaum et al. ........ 370/372 |
| 2004/0041258 A1 | * | 3/2004 | Song et al. .............. 257/723 |
| 2005/0189642 A1 | * | 9/2005 | Bolken et al. ............ 257/686 |
| 2005/0248006 A1 | * | 11/2005 | Corisis ................... 257/666 |
| 2007/0040247 A1 | * | 2/2007 | Lee et al. ................ 257/666 |

* cited by examiner

*Primary Examiner*—Alexander O Williams
(74) *Attorney, Agent, or Firm*—Saile Ackerman LLC; Stephen B. Ackerman

(57) ABSTRACT

A semiconductor die featuring vertical rows of bonding pad structures is disclosed. The rows of bonding pad structures are located vertically in the Y direction, or traversing the width of the semiconductor die. A vertical row of bonding pad structures is located on each side of the semiconductor die while a third vertical row of bonding pad structures is located in the center of the semiconductor die. A first set of wire bonds connect each bonding pad structure located on the sides of the semiconductor die to a conductive lead structure located on a ceramic package. A second set of wire bonds connect each bonding pad structure located in the center of the semiconductor die to a lead on chip (LOC) structure located on the semiconductor die. The configuration of only vertical rows of bonding pad structures allows optimized parallel testing of the completed semiconductor chip to be accomplished when compared to testing performed on a semiconductor chip featuring both vertical and horizontal rows of bonding pad structures located on all sides of the semiconductor chip.

7 Claims, 4 Drawing Sheets

SEMICONDUCTOR DIE STRUCTURE FEATURING A TRIPLE PAD ORGANIZATION

BACKGROUND OF THE INVENTION (1) Field of the Invention

The present invention relates to methods of fabricating and testing semiconductor chips, and more specifically to a novel pad design for a semiconductor chip or die allowing optimization of die testing to be accomplished.

(2) Description of Prior Art

The semiconductor industry is continually striving to increase performance of semiconductor chips while still reducing the fabrication or processing costs of these same chips. Reductions in fabrication costs have been accomplished via elimination of, or the combination of specific process steps or sequences such as the deposition of doped semiconductor layers rather than the more time consuming deposition of an intrinsic layer followed by a doping procedure. In addition the development of advanced semiconductor apparatus such as rapid thermal processing (RTP) tools have allowed the time needed for specific processes to be reduced. One aspect of processing, testing of the completed semiconductor chip, has not evidenced the cost optimization attention applied to other semiconductor processes.

This invention will describe a new pad organization for a semiconductor chip which will allow reduction of testing time for a specific chip to be realized. Prior art such as Whetsel in U.S. Pat. No. 6,326,801 B1, Littlebury in U.S. Pat. No. 5,012,187, Yasuda et al in U.S. Pat. No. 6,469,327 B1, Loughmiller et al in U.S. Pat. No. 6,396,300 B1, and Quinn et al in U.S. Pat. No. 4,685,998, disclose various contact pad designs, however none of the above prior art describe the novel pad design disclosed in this present invention in which specific chip pad designs for improving for improving testing and reducing costs are featured.

SUMMARY OF THE INVENTION

It is an object of this invention to reduce the time needed to test semiconductor chips.

It is another object of this invention to fabricate a bonding pad organization which allows the time needed for testing of a completed semiconductor chip to be reduced.

It is still another object of this invention to fabricate a bonding pad organization which allows parallel testing to be employed resulting in a greater number of semiconductor chips to be tested when compared to non-parallel semiconductor chip testing procedures.

It is still yet another object of this invention to employ a semiconductor chip featuring three vertical rows of bonding pads, one on each end and one in the center of the semiconductor chip.

In accordance with the present invention a semiconductor chip design featuring three vertical rows of bonding pads is described. The conductive interconnect wiring in a semiconductor substrate used to access underlying elements and components of semiconductor devices in the same semiconductor substrate is formed and designed to result in three vertical rows of bonding pads at the top surface of each semiconductor chip. A row of bonding pads vertically aligned in the Y direction is located along each side of the semiconductor chip while a third row vertically aligned in the Y direction is located in the center of the semiconductor chip. Prior to dicing parallel testing of each semiconductor chip is performed along only the Y direction using a probe card via access of the three vertical rows of boding pads. After dicing and placement of semiconductor dies on underlying ceramic modules or packages, organic tape is formed on specific regions of each semiconductor die. Conductive leads on the ceramic package are placed adjacent to the two outside vertical rows of bonding pads while other conductive leads, leads on chip (LOC), also originating from the ceramic package terminate on the underlying organic tape adjacent to the middle row of vertical bonding pads. Wiring bonding is next used to connect the conductive leads to adjacent bonding pads.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

A semiconductor chip is obtained via fabrication of a specific pattern or design of devices and circuits in a specific area of a semiconductor substrate or wafer, with the specific pattern or device design replicated in the semiconductor wafer allowing a multitude of identical semiconductor chips to be formed in the semiconductor wafer. Each semiconductor chip is comprised of active devices formed in the semiconductor substrate with overlying conductive circuitry connecting the active device components resulting in the desired device arrays and circuits. The overlying conductive circuitry is comprised of metal interconnect structures which eventually terminate near the top surface of the semiconductor chip allowing bonding or connection of the desired device circuitry in the semiconductor substrate to be made to exterior packages. The top surface of a semiconductor chip features bonding pad structures which will serve as the interface between the underlying conductive circuitry of the semiconductor chip and an overlying wire bond of a external package. In addition to providing the structure needed for wire bonding to an exterior package the bonding pads also provide the conductive element that allows testing of each semiconductor chip to be performed prior to the semiconductor chip separation or dicing procedure. Testing of the semiconductor chips to address device performance and yield is performed via parallel testing procedures using probe cards.

Figure 1:
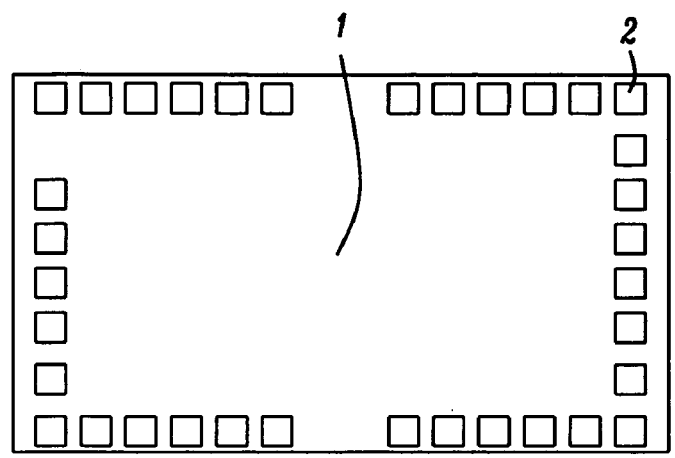
FIGS. 1-2, which schematically show a top view of a semiconductor die, and of semiconductor chips in and on an semiconductor substrate, featuring bonding pads located on all four sides of the semiconductor chip or die.
Figure 2:
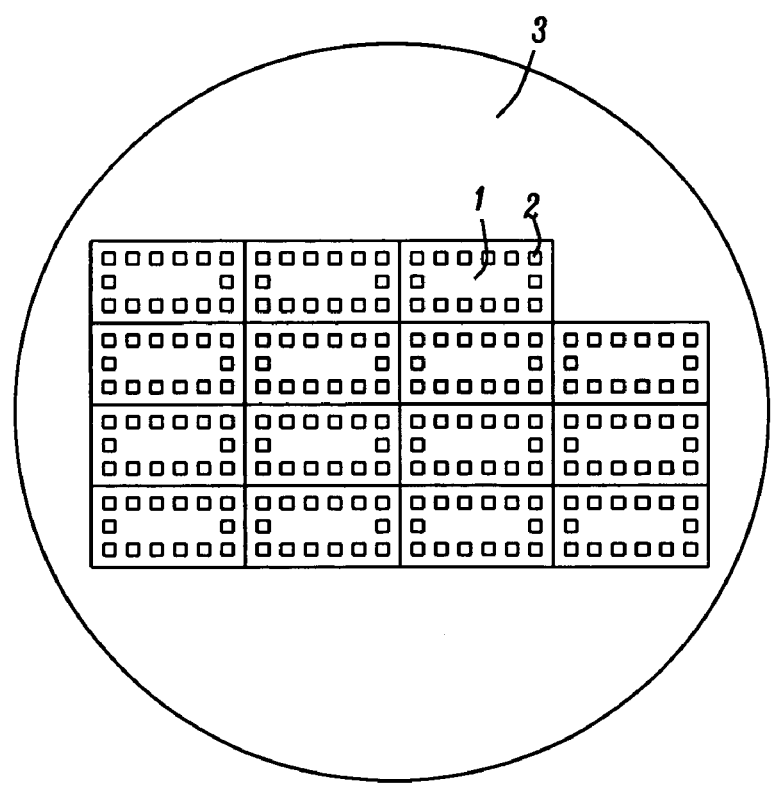

FIG. 1, schematically shows an individual semiconductor die or chip 1, formed in a semiconductor substrate. Bonding pads 2, on the top surface of semiconductor chip or die 1, are shown on all sides of the semiconductor chip or die. The design of the underlying conductive circuitry, (not shown in the drawings), resulted in bonding pads 2, located on all sides of semiconductor chip or die 1. FIG. 2, shows semiconductor wafer 3, with the multitude of identical semiconductor dies 1, all fabricated featuring bonding pads 2, located on all sides of the semiconductor chip or die. The design of the bonding pads located on all sides of semiconductor chip 1, can however adversely influence testing of each completed semiconductor chip. Testing of each semiconductor chip, used to assess chip performance and yield, is performed prior to a dicing procedure applied to semiconductor wafer 3. Testing procedures are performed using a probe card and are performed using parallel testing methods. However the alignment of bonding pads 2, on all sides of semiconductor chip 1, make semiconductor chip testing difficult to achieve with probe cards, and the number of devices to be tested is less, as the result, thus increasing test time and cost of each semiconductor chip.

Figure 3:
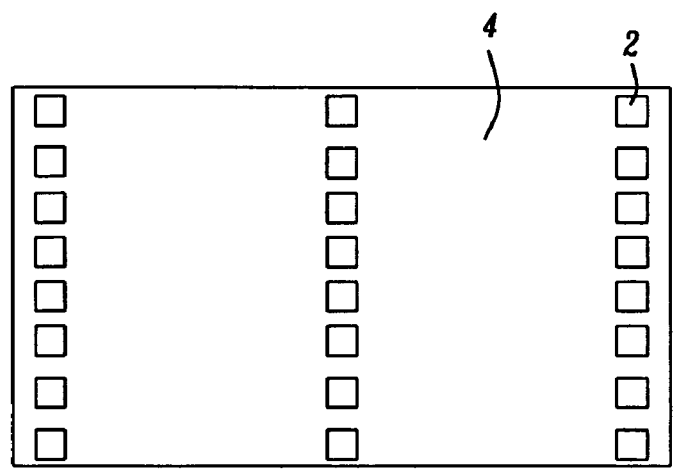
FIGS. 3-4, which schematically show a top view of a semiconductor die, and of semiconductor chips in and on an underlying semiconductor substrate, featuring three vertical rows of bonding pads located in the Y direction, with one vertical row of bonding pads located on each side of the semiconductor chip or die and with the third vertical row located in the center of the semiconductor chip or die.
Figure 4:
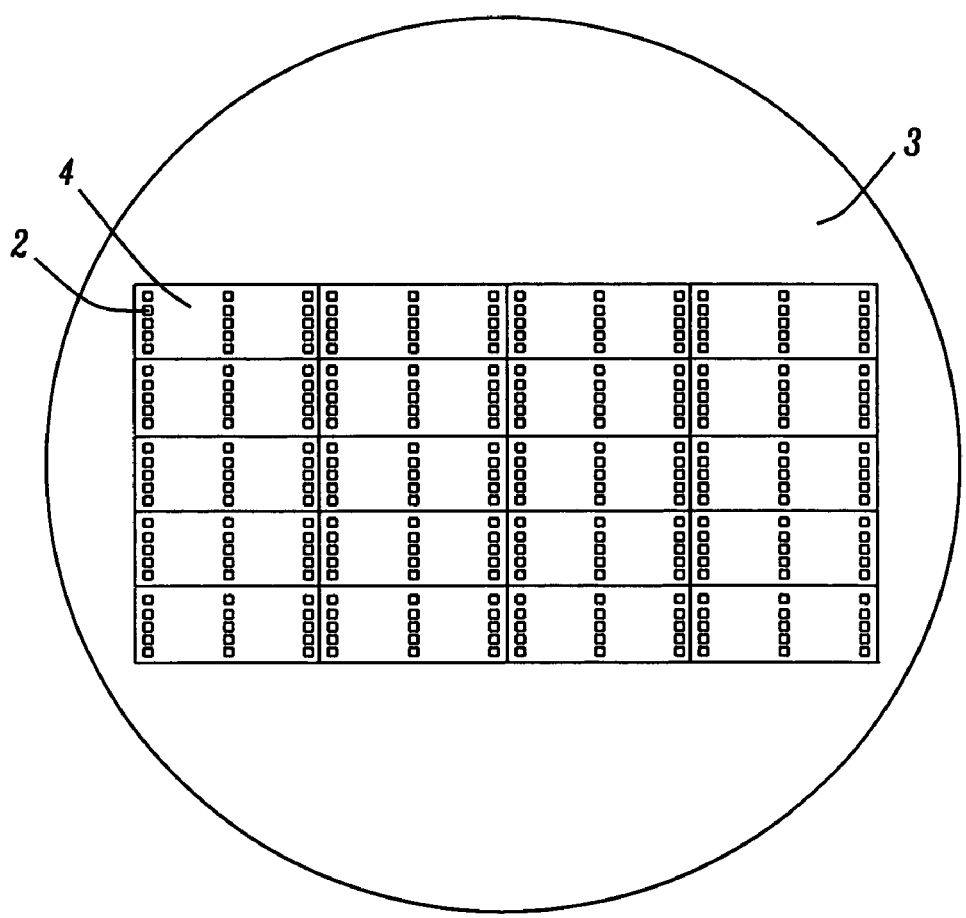

To avoid the unwanted additional cost of testing resulting from the location of bonding pads on all sides of a semiconductor chip, a design resulting in only vertical rows of bonding pads has been developed and schematically described using FIGS. 3-4. Maintaining the desired device components and arrays in the semiconductor substrate overlying conductive circuitry is now designed to allow termination of the uppermost interconnect metal structure to be accessed via three vertical rows of bonding pads. FIG. 3, schematically shows a top view of semiconductor die or chip 4, featuring three vertical rows of bonding pads 2. The number of bonding pads, three vertical rows for a 86 pin thin small outline package (TSOP) described as an example in FIG. 3, are the same as the number of bonding pads previously shown on for the design used for an 86 pin TSOP design in semiconductor chip 1, previously shown in FIG. 1, where all sides of the semiconductor chip were used to accommodate bonding pads. FIG. 4, schematically shows undiced semiconductor chips 4, of semiconductor wafer 3, each comprised with three vertical rows of bonding pads 2. Parallel wafer testing now performed in only one direction allows a greater number of chips to be tested employing testing times equal to or less than times used to test counterpart semiconductor chips comprised with bonding pads on all sides.

Figure 5A:
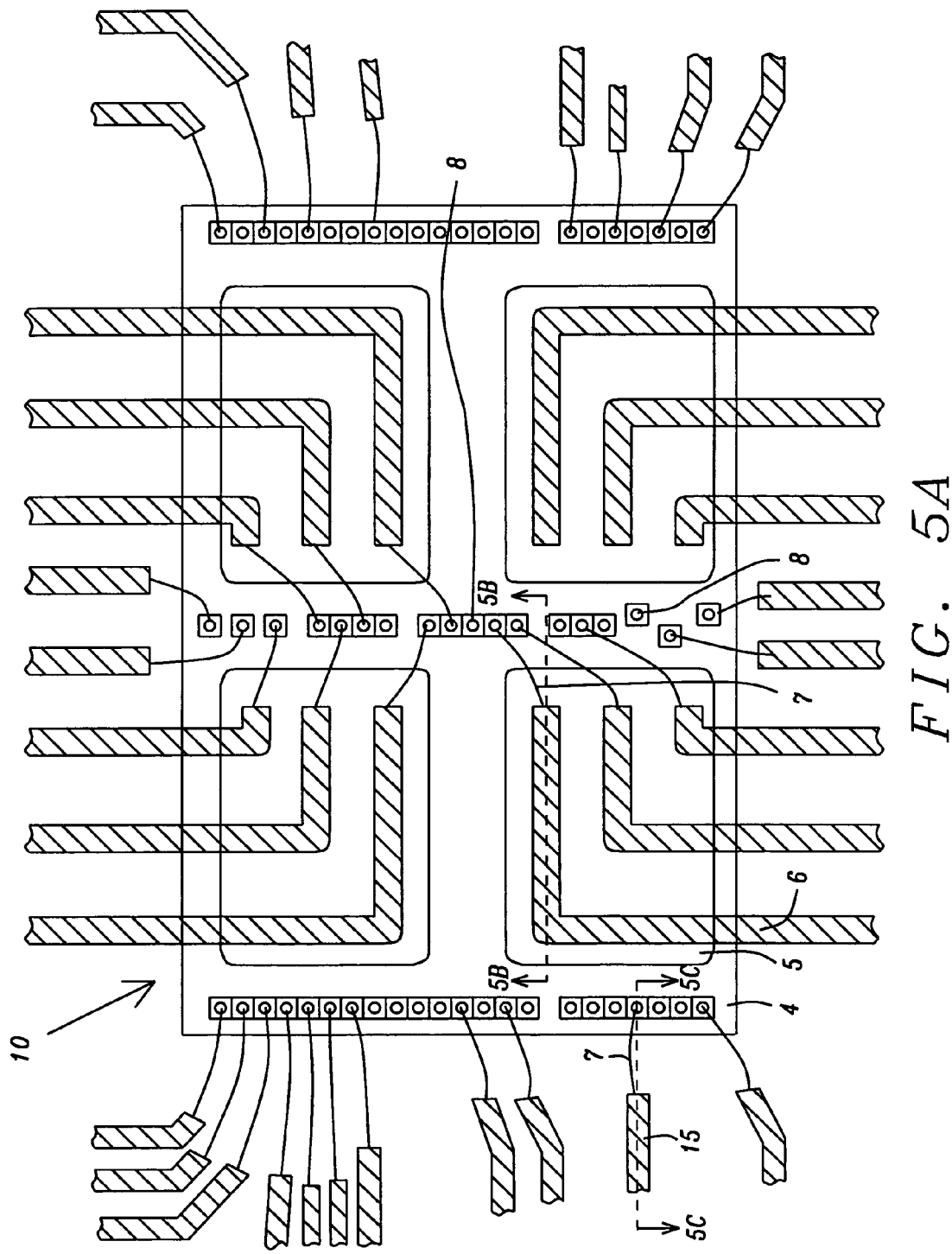
FIG. 5A, which schematically shows a top view of a semiconductor die on an underlying ceramic package wherein the semiconductor die is comprised with three vertical rows of bonding pads, and wherein wire bonds are shown connecting conductive leads originating from the ceramic package to all three vertical rows of bonding pads.
Figure 5B:
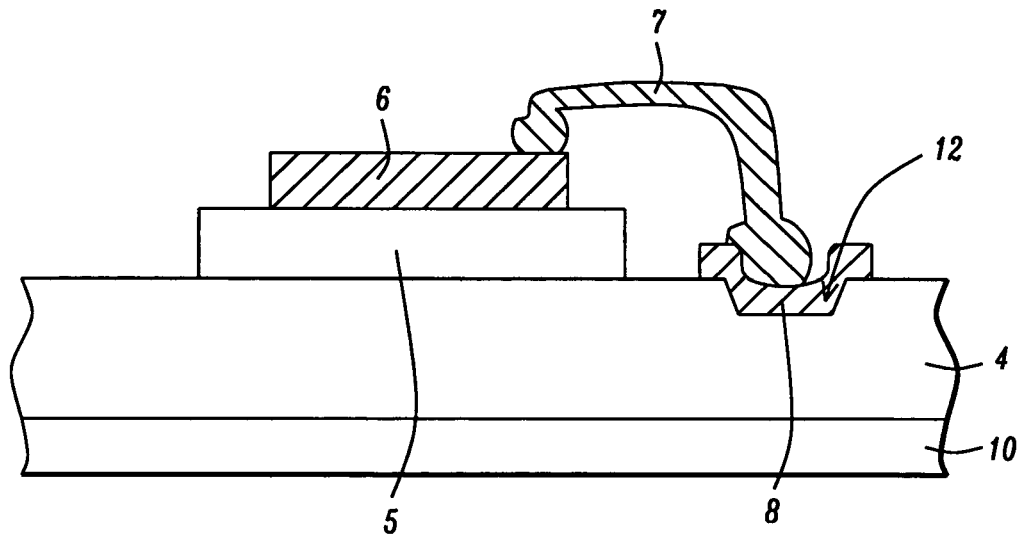
FIGS. 5B-5C, which schematically in cross-sectional style, show wire bond connections of bonding pads to conductive leads.
Figure 5C:
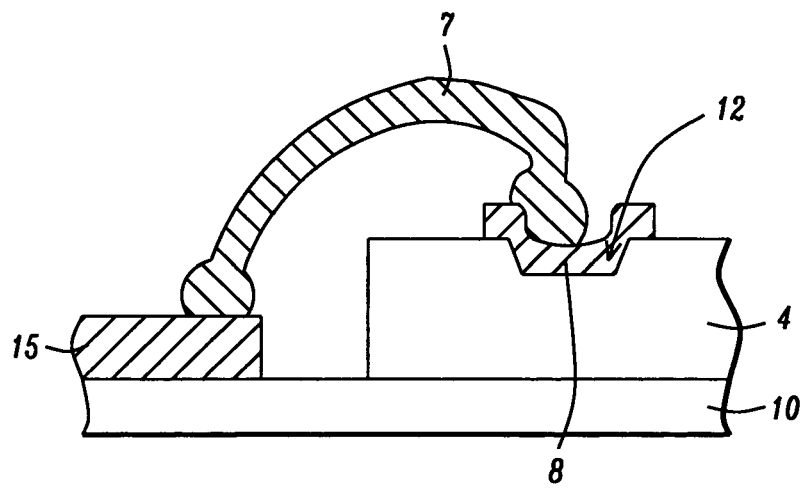

FIGS. 5A-5C, schematically show top and cross-sectional views of the semiconductor chip or die comprised with three rows of bonding pads conductively connected to an external package via wire bonding. A top view of semiconductor die 4, is schematically shown in FIG. 5A, featuring three rows of vertical bonding pads 8. A vertical row is located on each side of semiconductor die 4, in the Y direction, with a third vertical row aligned in the same Y direction in the center of semiconductor die 4. For this example 86 bonding pads are employed for a 86 pin TSOP design. Shown schematically in FIG. 5A, are four organic tape sections 5, located on portions of semiconductor die 4. Organic tape sections 5, are comprised of polyimide materials such as resin, at a thickness between about 90 to 110 micrometers (um). Conductive leads 15, comprised of alloy, are shown located only on external package 10. External package 10, a ceramic module which will allow communication between semiconductor die 4, and external hardware to occur, is in turn comprised with internal and external conductive wiring. Conductive leads 15, comprised with a width between about 90 to 110 um, and at a thickness between about 120 to 140 um, are not located on semiconductor die 4, placed only on ceramic module 10, in positions adjacent to the vertical rows of bonding pads located on each vertical side of semiconductor die 4. Lead on chip (LOC) structures 6, initiating on ceramic module 10, do traverse semiconductor die 4, terminating at a position adjacent to the vertical row of bonding pads located in the center of semiconductor die 4. LOC structures 6, comprised of alloy, at a thickness between about 120 to 140 um, and with a width between about 90 to 110 um, terminate on a portion of semiconductor die 4, overlying organic tape 5. Wire bonds 7, comprised of gold, are shown schematically in FIG. 5A, connecting conductive leads 15, to the vertical rows of bonding pads along the sides of semiconductor die 4, while LOC structures 6, are shown wire bonded to the vertical row of bonding pads located in the Y direction in the center of semiconductor die 4.

Referring to FIGS. 5B and 5C, openings or via holes 12, are formed in an insulator layer component of semiconductor chip 4, exposing a portion of a top surface of a upper level metal interconnect structure, (the insulator layer and upper level metal interconnect structure are not shown in the drawings). The upper level metal interconnect, a component of the conductive device circuitry, communicates with underlying lower level metal interconnect structures which in turn communicate with the device arrays in the semiconductor substrate. Bonding pads 8, are next formed in via holes 12, overlying exposed portions of the upper level metal interconnect structures. Bonding pads 8, can be a composite metal layer comprised of an underlying chromium component used for adhesion to the surfaces of the via opening, and comprised of an overlying gold or gold-copper component to be used to accept a subsequent wire bond. Wire bond 7, comprised of gold is shown in FIG. 5C, connecting conductive lead 15, to bonding pad 8, in a region in which a vertical row of bonding pads is located on the side of semiconductor die 4. FIG. 5B, schematically in cross-sectional style shows bonding pad 8, connected to LOC structure 6, via wire bond 7.

Therefore decreased testing time in addition to the ability to test increased number of semiconductor chips has been realized via a novel semiconductor chip design featuring all rows of bonding pads aligned in vertical or Y directions.

While this invention has been particularly shown and described with reference to, the preferred embodiments thereof, it will be understood by those skilled in the art that various changes in form and details may be made without departing from the spirit and scope of this invention.

What is claimed is:

1. A semiconductor die on a packaging structure, comprising:
   a width in the Y direction of said semiconductor die smaller than the length in the X direction of said semiconductor die; traversing
   rows of bonding pad structures wherein each row is comprised of individual bonding pad structures all aligned vertically in a Y direction, wherein a first vertical row and a second vertical row of bonding pad structures are located on each side of the semiconductor die, and wherein a third vertical row of bonding pad structures is located in the center of said semiconductor die;
   conductive lead structures on said packaging structure wherein each conductive lead structure is located adjacent to a bonding pad structure component of either said first vertical row, or of said second vertical row of bonding pad structures;
   four polyimide organic tape structures each located in a quadrant of said semiconductor die, and with each organic tape structure located on a portion of said semiconductor die not occupied by said rows of bonding pad structures;

lead on chip (LOC) structures with each LOC structure comprised of a first portion located on said packaging structure and with a second portion located on a polyimide organic tape structure, wherein second portion of said LOC structure terminates adjacent to a bonding pad structure component of said third vertical row of bonding pad structures located in the center of said semiconductor die;

a first group of conductive wires wherein each wire of said first group of conductive wires connects a bonding pad structure of said first vertical row; or of said second vertical row of bonding pad structures to a conductive leads structure; and a second group of conductive wires wherein each wire of said second group of conductive wires connects a bonding pad structure of said third vertical row of bonding pad structures to a LOC structure.

2. The semiconductor die of claim 1, wherein each bonding pad structure is comprised of a metal composite layer featuring an underlying chromium layer and an overlying gold or copper layer.

3. The semiconductor die of claim 1, wherein each bonding pad structure is located overlying a metal interconnect structure exposed in an via opening in an insulator layer, wherein the insulator layer is the top layer of said semiconductor die.

4. The semiconductor die of claim 1, wherein said conductive lead structures are comprised of alloy, with a width between about 90 to 110 um, and at a thickness between about 120 to 140 um.

5. The semiconductor die of claim 1, wherein said lead on chip (LOC) structures are comprised of alloy, with a width between about 90 to 110 um, and at a thickness between about 120 to 140 um.

6. The semiconductor die of claim 1, wherein said polyimide organic tape structures are comprised at a thickness between about 90 to 110 um.

7. The semiconductor die of claim 1, wherein said first conductive wires and said conductive wires are gold wires.

* * * * *